(12) United States Patent
Arai

(10) Patent No.: US 11,469,217 B2
(45) Date of Patent: Oct. 11, 2022

(54) SEMICONDUCTOR DEVICE AND MANUFACTURING METHOD THEREOF

(71) Applicant: Kioxia Corporation, Tokyo (JP)

(72) Inventor: Shinya Arai, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/007,719

(22) Filed: Aug. 31, 2020

(65) Prior Publication Data

US 2021/0265314 A1    Aug. 26, 2021

(30) Foreign Application Priority Data

Feb. 26, 2020    (JP) .............................. JP2020-030950

(51) Int. Cl.
*H01L 25/065*    (2006.01)
*H01L 23/538*    (2006.01)
*H01L 21/50*    (2006.01)
*H01L 23/544*    (2006.01)

(52) U.S. Cl.
CPC .......... *H01L 25/0657* (2013.01); *H01L 21/50* (2013.01); *H01L 23/5385* (2013.01); *H01L 23/5386* (2013.01); *H01L 23/544* (2013.01)

(58) Field of Classification Search
CPC ............. H01L 25/0657; H01L 23/5385; H01L 23/4824
See application file for complete search history.

(56) References Cited

U.S. PATENT DOCUMENTS

| | | | |
|---|---|---|---|
| 10,727,215 B1* | 7/2020 | Zhang | H01L 24/08 |
| 2018/0261575 A1* | 9/2018 | Tagami | H01L 24/08 |
| 2019/0164914 A1 | 5/2019 | Hu et al. | |
| 2020/0295037 A1* | 9/2020 | Iijima | H01L 24/09 |

FOREIGN PATENT DOCUMENTS

| | | |
|---|---|---|
| JP | 2010-129686 A | 6/2010 |
| TW | 201926408 A | 7/2019 |

* cited by examiner

*Primary Examiner* — Dale E Page
*Assistant Examiner* — Wilner Jean Baptiste
(74) *Attorney, Agent, or Firm* — Foley & Lardner LLP

(57) ABSTRACT

A semiconductor device includes a first chip and a second chip bonded to the first chip. The first chip includes: a substrate; a logic circuit disposed on the substrate; and a plurality of first dummy pads that are disposed above the logic circuit, are disposed on a first bonding surface where the first chip is bonded to the second chip, the plurality of first dummy pads not being electrically connected to the logic circuit. The second chip includes a plurality of second dummy pads disposed on the plurality of first dummy pads and a memory cell array provided above the plurality of second dummy pads. A coverage of the first dummy pads on the first bonding surface is different between a first region and a second region, the first region separated from a first end side of the first chip, the second region disposed between the first end side and the first region.

14 Claims, 14 Drawing Sheets

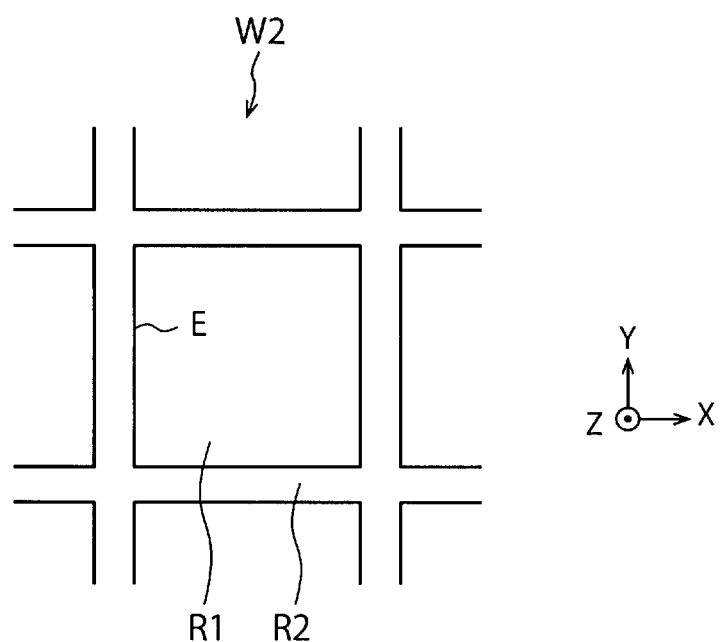

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2020-030950, filed Feb. 26, 2020, the entire contents of which are incorporated herein by reference.

FIELD

Embodiments described herein relate generally to a semiconductor device and a manufacturing method thereof.

BACKGROUND

When a semiconductor device is manufactured by bonding metal pads of a plurality of wafers, defects such as voids may occur in an interlayer insulating film in which the metal pads are embedded.

DESCRIPTION OF THE DRAWINGS

FIG. 5 is a plan view schematically showing a structure of a circuit wafer according to the first embodiment.

DETAILED DESCRIPTION

Figure 1:
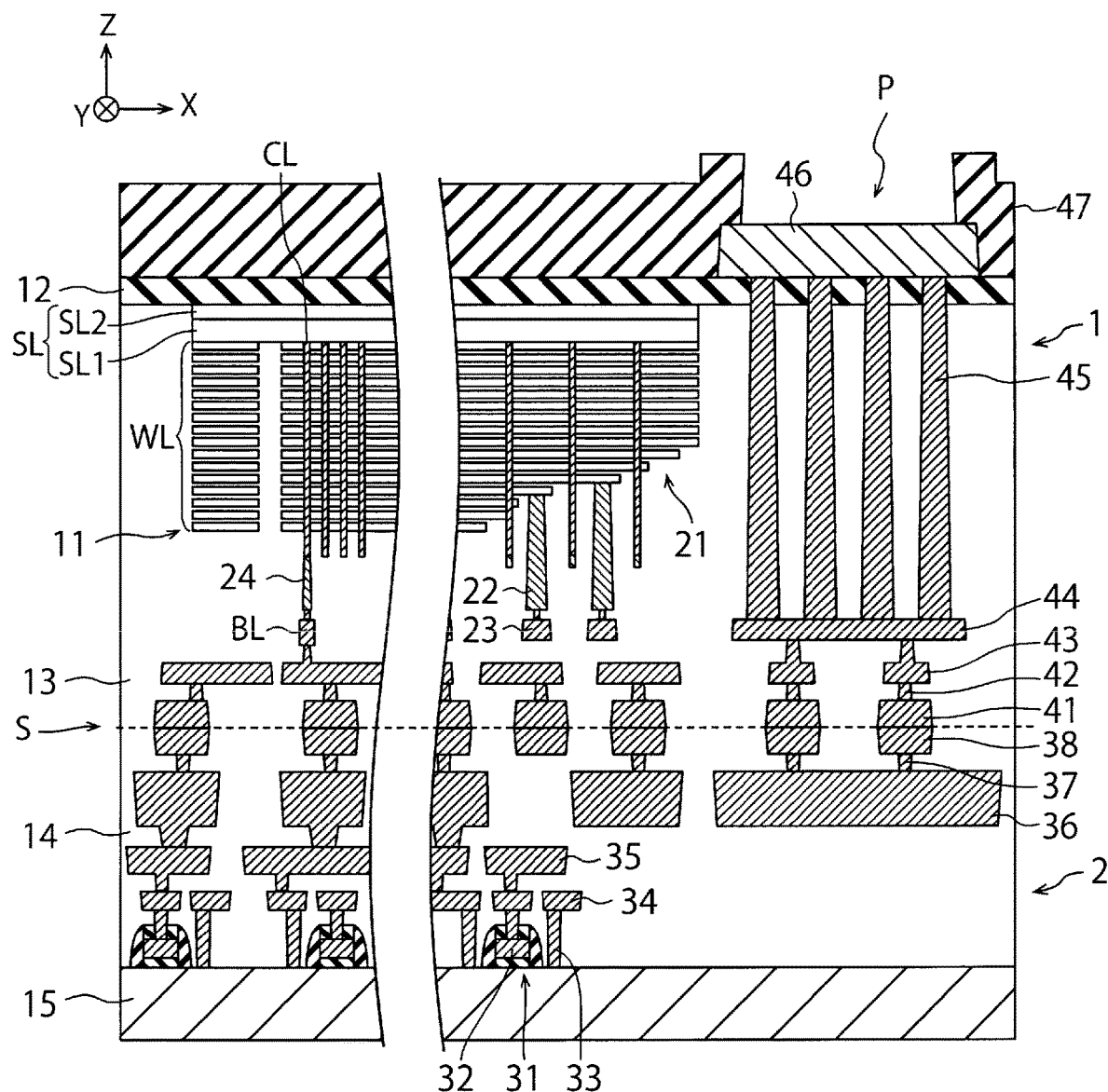
FIG. 1 is a cross-sectional view showing a structure of a semiconductor device according to a first embodiment.

At least one embodiment provides a semiconductor device capable of reducing defects in an insulating film in which pads are embedded, and a manufacturing method thereof.

In general, according to at least one embodiment, a semiconductor device includes a first chip and a second chip bonded to the first chip. The first chip includes a substrate; a logic circuit disposed on the substrate; and a plurality of first dummy pads that are disposed above the logic circuit, are provided on a first bonding surface where the first chip is bonded to the second chip, with the plurality of first dummy pads not being electrically connected to the logic circuit. The second chip includes a plurality of second dummy pads disposed on the plurality of first dummy pads and a memory cell array disposed above the plurality of second dummy pads. A coverage of the first dummy pads on the first bonding surface is different between a first region and a second region, the first region separated from a first end side of the first chip, the second region disposed between the first end side and the first region.

Hereinafter, embodiments of the present disclosure will be described with reference to the drawings. In FIGS. 1 to 14, the same components are denoted by the same reference numerals, and a repetitive description thereof will be omitted.

First Embodiment

FIG. 1 is a cross-sectional view showing a structure of a semiconductor device according to a first embodiment. The semiconductor device of FIG. 1 is a three-dimensional memory in which an array chip 1 and a circuit chip 2 are bonded. The circuit chip 2 is an example of the first chip, and the array chip 1 is an example of the second chip.

The array chip 1 includes a memory cell array 11 including a plurality of memory cells, an insulating film 12 on the memory cell array 11, and an interlayer insulating film 13 under the memory cell array 11. The insulating film 12 may be, for example, a silicon oxide film or a silicon nitride film. The interlayer insulating film 13 is, for example, a stacked film including a silicon oxide film or a silicon oxide film and another insulating film.

The circuit chip 2 is provided under the array chip 1. Reference numeral S indicates a bonding surface between the array chip 1 and the circuit chip 2. The bonding surface S is an example of the first bonding surface. The circuit chip 2 includes an interlayer insulating film 14 and a substrate 15 under the interlayer insulating film 14. The interlayer insulating film 14 is, for example, a stacked film including a silicon oxide film or a silicon oxide film and another insulating film. The substrate 15 is, for example, a semiconductor substrate such as a silicon substrate.

FIG. 1 shows an X direction and a Y direction, which are perpendicular to each other and parallel with a surface of the substrate 15, and a Z direction that is perpendicular to the surface of the substrate 15. In this specification, a +Z direction is taken as an upper direction and a −Z direction is taken as a lower direction. The −Z direction may or may not coincide with a gravity direction.

The array chip 1 includes a plurality of word lines WL and a source line SL as an electrode layer in the memory cell array 11. FIG. 1 shows a staircase structure portion 21 of the memory cell array 11. Each word line WL is electrically connected to a word wiring layer 23 via a contact plug 22. Each columnar portion CL penetrating the plurality of word lines WL is electrically connected to a bit line BL via a via plug 24, and is electrically connected to the source line SL. The source line SL includes a first layer SL1 which is a semiconductor layer and a second layer SL2 which is a metal layer.

The circuit chip 2 includes a plurality of transistors 31. Each transistor 31 includes a gate electrode 32 provided on the substrate 15 via a gate insulating film, and a source diffusion layer and a drain diffusion layer (not shown) provided in the substrate 15. Further, the circuit chip 2 includes a plurality of contact plugs 33 each provided on the gate electrode 32, the source diffusion layer, or the drain diffusion layer of the transistor 31, a wiring layer 34 provided on the contact plugs 33 and including a plurality of wirings, and a wiring layer 35 provided on the wiring layer 34 and including a plurality of wirings.

The circuit chip 2 may further include a wiring layer 36 provided on the wiring layer 35 and may include a plurality of wirings, a plurality of via plugs 37 provided on the wiring layer 36, and a plurality of metal pads 38 provided on the via plugs 37. The metal pad 38 is, for example, a Cu (copper) layer or an Al (aluminum) layer. The metal pad 38 is an example of a first pad (first active pad and first dummy pad). Details of the metal pad 38 will be described later. The circuit chip 2 functions as a control circuit (logic circuit) that controls an operation of the array chip 1. The control circuit may include transistors 31 and the like, and is electrically connected to the metal pads 38.

The array chip 1 includes a plurality of metal pads 41 provided on the metal pads 38, and a plurality of via plugs 42 provided on the metal pads 41. Further, the array chip 1 is provided on the via plugs 42, and includes a wiring layer 43 including a plurality of wirings, and a wiring layer 44 provided on the wiring layer 43 and including a plurality of wirings. The metal pad 41 is, for example, a Cu layer or an Al layer. The metal pad 41 is an example of a second pad (second active pad and second dummy pad). Details of the metal pad 41 will be described later.

The array chip 1 further includes a plurality of via plugs 45 provided on the wiring layer 44, a metal pad 46 provided on the via plugs 45 and the insulating film 12, and a passivation film 47 provided on the metal pad 46 and the insulating film 12. The metal pad 46 is, for example, a Cu layer or an Al layer, and functions as an external connection pad (bonding pad) of the semiconductor device of FIG. 1. The passivation film 47 is, for example, an insulating film such as a silicon oxide film, and has an opening P that causes an upper surface of the metal pad 46 to be exposed. The metal pad 46 may be connected to a mounting substrate or another device through the opening P by a bonding wire, a solder ball, a metal bump, and the like.

Figure 2:
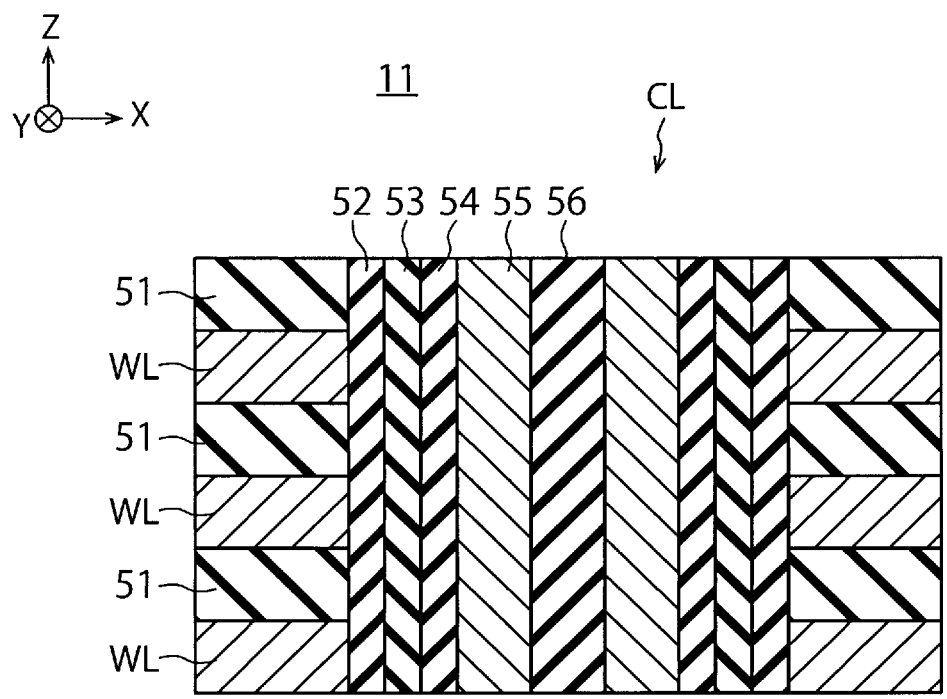
FIG. 2 is a cross-sectional view showing a structure of a columnar portion according to the first embodiment.

FIG. 2 is a cross-sectional view showing a structure of a columnar portion CL according to the first embodiment.

As shown in FIG. 2, the memory cell array 11 includes a plurality of word lines WL and a plurality of insulating layers 51 alternately stacked on the interlayer insulating film 13 (FIG. 1). The word line WL is, for example, a W (tungsten) layer. The insulating layer 51 is, for example, a silicon oxide film.

The columnar portion CL successively includes a block insulating film 52, a charge storage layer 53, a tunnel insulating film 54, a channel semiconductor layer 55, and a core insulating film 56. The charge storage layer 53 is, for example, a silicon nitride film, and is formed on a side surface of the word lines WL and the insulating layers 51 via the block insulating film 52. The charge storage layer 53 may be a semiconductor layer such as a polysilicon layer. The channel semiconductor layer 55 is, for example, a polysilicon layer, and is formed on a side surface of the charge storage layer 53 via the tunnel insulating film 54. The block insulating film 52, the tunnel insulating film 54, and the core insulating film 56 are, for example, silicon oxide films or metal insulating films.

Figure 3:
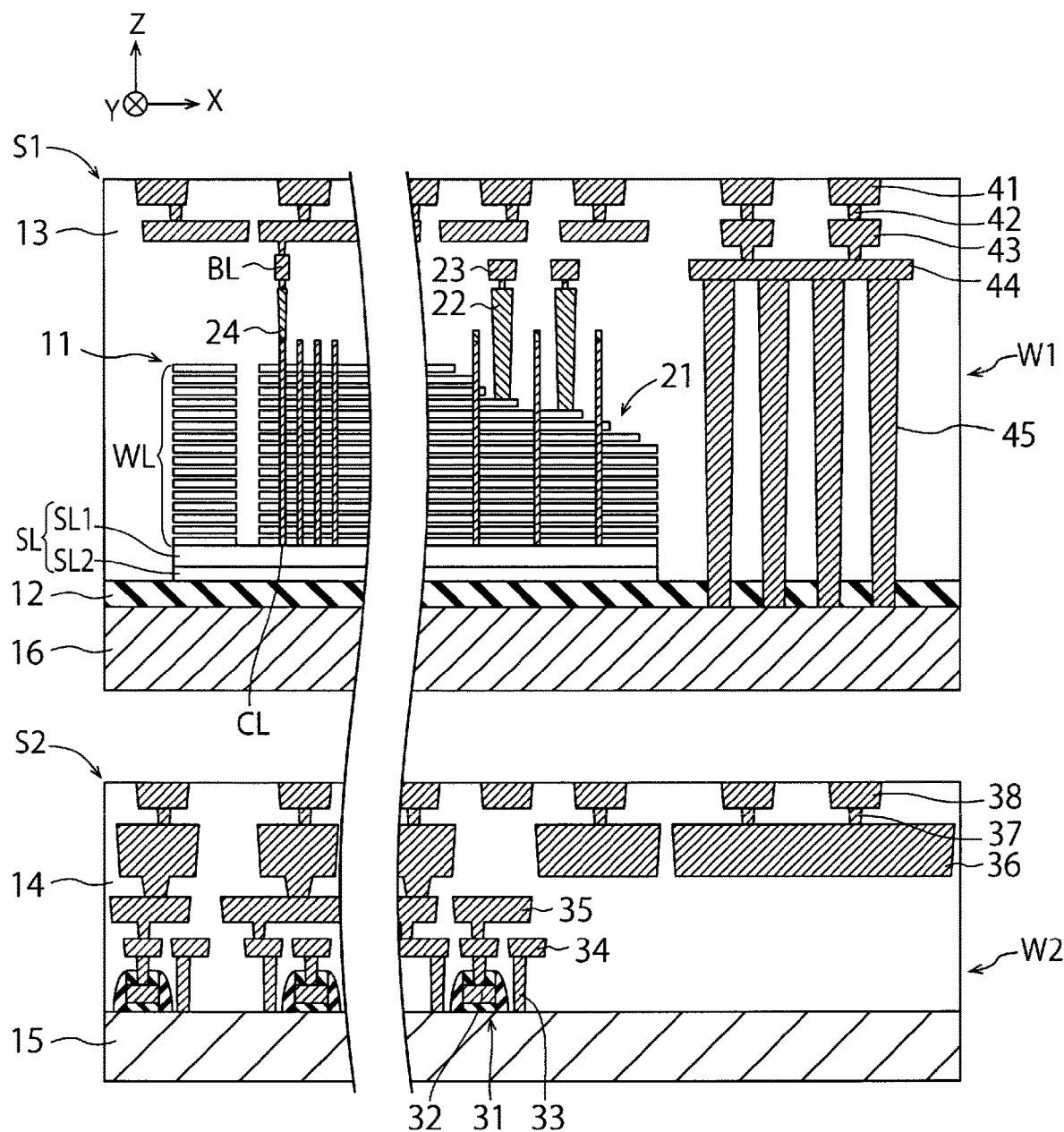
FIG. 3 is a cross-sectional view (1/2) showing a manufacturing method of the semiconductor device according to the first embodiment.
Figure 4:
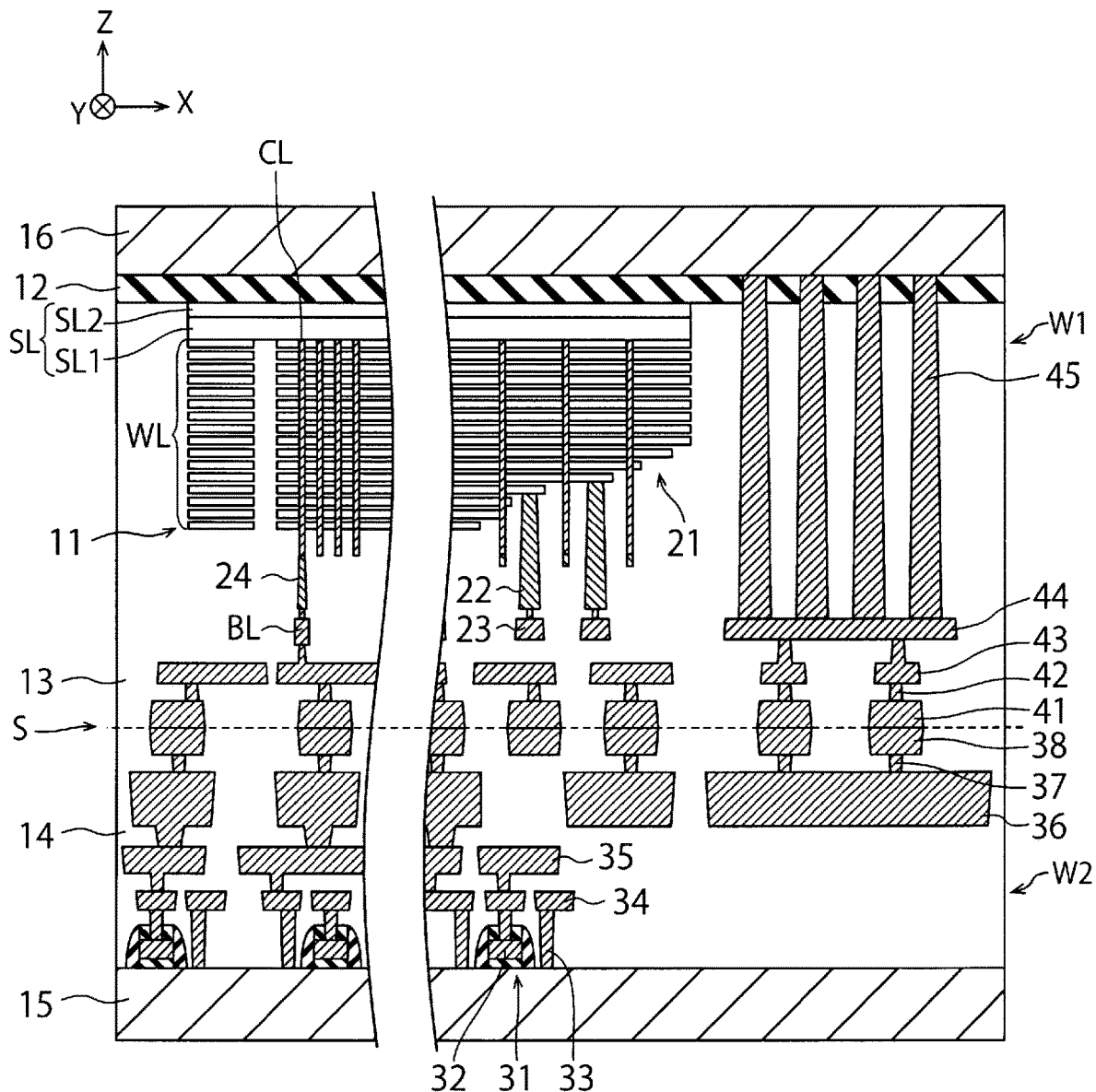
FIG. 4 is a cross-sectional view (2/2) showing the manufacturing method of the semiconductor device according to the first embodiment.

FIGS. 3 and 4 are cross-sectional views showing a manufacturing method of the semiconductor device according to the first embodiment.

FIG. 3 shows an array wafer W1 including a plurality of array chips 1, and a circuit wafer W2 including a plurality of circuit chips 2. The array wafer W1 is also referred to as a "memory wafer", and the circuit wafer W2 is also referred to as a "CMOS wafer". The circuit wafer W2 is an example of a first wafer, and the array wafer W1 is an example of a second wafer.

The orientation of the array wafer W1 of FIG. 3 is opposite to the orientation of the array chip 1 of FIG. 1. In at least one embodiment, the array wafer W1 and the circuit wafer W2 are bonded together to manufacture the semiconductor device. FIG. 3 shows the array wafer W1 before the orientation is reversed to bond, and FIG. 1 shows the array chip 1 after the orientation is reversed to bond, and after bonding and dicing.

In FIG. 3, reference numeral S1 indicates an upper surface of the array wafer W1, and reference numeral S2 indicates an upper surface of the circuit wafer W2. The array wafer W1 includes a substrate 16 provided under the insulating film 12. The substrate 16 is, for example, a semiconductor substrate such as a silicon substrate. The substrate 15 is an example of a first substrate, and the substrate 16 is an example of a second substrate.

In at least one embodiment, first, as shown in FIG. 3, the memory cell array 11, the insulating film 12, the interlayer insulating film 13, the staircase structure portion 21, the metal pad 41, and the like are formed on the substrate 16 of the array wafer W1, and the interlayer insulating film 14, the transistor 31, the metal pad 38, and the like are formed on the substrate 15 of the circuit wafer W2. For example, the via plug 45, the wiring layer 44, the wiring layer 43, the via plug 42, and the metal pad 41 are sequentially formed on the substrate 16. Further, the contact plug 33, the wiring layer 34, the wiring layer 35, the wiring layer 36, the via plug 37, and the metal pad 38 are sequentially formed on the substrate 15. Next, as shown in FIG. 4, the array wafer W1 and the circuit wafer W2 are bonded together by a mechanical pressure. Accordingly, the interlayer insulating film 13 and the interlayer insulating film 14 are bonded. Next, the array wafer W1 and the circuit wafer W2 are annealed at 400° C. Accordingly, the metal pad 41 and the metal pad 38 are joined together.

Thereafter, the array wafer W1 and the circuit wafer W2 are cut into a plurality of chips after the substrate 15 is thinned by chemical mechanical polishing (CMP) and the substrate 16 is removed by CMP. Accordingly, the semiconductor device in FIG. 1 may be manufactured. FIG. 1 shows the circuit chip 2 including the metal pad 38 and the array chip 1 including the metal pad 41 disposed on the metal pad 38. The metal pad 46 and the passivation film 47 are formed on the insulating film 12, for example, after the substrate 15 is thinned and the substrate 16 is removed.

Although the array wafer W1 and the circuit wafer W2 are bonded together in at least one embodiment, the array wafers W1 may be bonded together instead. The contents described above with reference to FIGS. 1 to 4 and contents described later with reference to FIGS. 5 to 14 are also applicable to bonding of the array wafers W1 to each other.

Although FIG. 1 shows a boundary surface between the interlayer insulating film 13 and the interlayer insulating film 14, and a boundary surface between the metal pad 41 and the metal pad 38, it is common that these boundary surfaces are not observed after the annealing. However, positions of these boundary surfaces can be estimated by detecting, for example, an inclination of a side surface of the metal pad 41 or a side surface of the metal pad 38, or a positional deviation between the side surface of the metal pad 41 and the metal pad 38.

The semiconductor device of at least one embodiment may be a target of a transaction in a state of FIG. 1 after being cut into the plurality of chips, or a target of a transaction in a state of FIG. 4 before being cut into the plurality of chips. FIG. 1 shows the semiconductor device in a chip state, and FIG. 4 shows the semiconductor device in a wafer state. In at least one embodiment, a multi-chip-shaped semiconductor device (FIG. 1) is manufactured from one wafer-shaped semiconductor device (FIG. 4).

Hereinafter, the circuit wafer W2 of at least one embodiment will be described in detail with reference to FIGS. 5 to 14, and specifically, the arrangement of the metal pads 38 of at least one embodiment will be described in detail. The following description is also applicable to the array wafer W1 of at least one embodiment and the arrangement of the metal pads 41 of at least one embodiment.

FIG. 5 is a plan view schematically showing a structure of the circuit wafer W2 according to the first embodiment.

As shown in FIG. 5, the circuit wafer W2 of at least one embodiment includes a plurality of chip regions R1 arranged in a two-dimensional array and a dicing region R2 surrounding the chip regions R1. The dicing region R2 has a shape including a plurality of dicing lines extending in the X direction and a plurality of dicing lines extending in the Y direction. FIG. 5 further shows a boundary line (boundary surface) E between the chip region R1 and the dicing region R2.

The circuit wafer W2 of at least one embodiment is bonded to the array wafer W1 and then cut into the plurality of chips. At this time, the circuit wafer W2 is processed by cutting the dicing region R2 with a dicing blade. Each chip obtained by cutting includes one chip region R1 of the circuit wafer W2 and one similar chip region of the array wafer W1. In this case, the boundary surface E is an end surface (end side) of each chip. The end surface of each chip includes a side surface of the substrate 15 and a side surface of the interlayer insulating film 14. The end side is an example of the first end side.

Figure 6A:
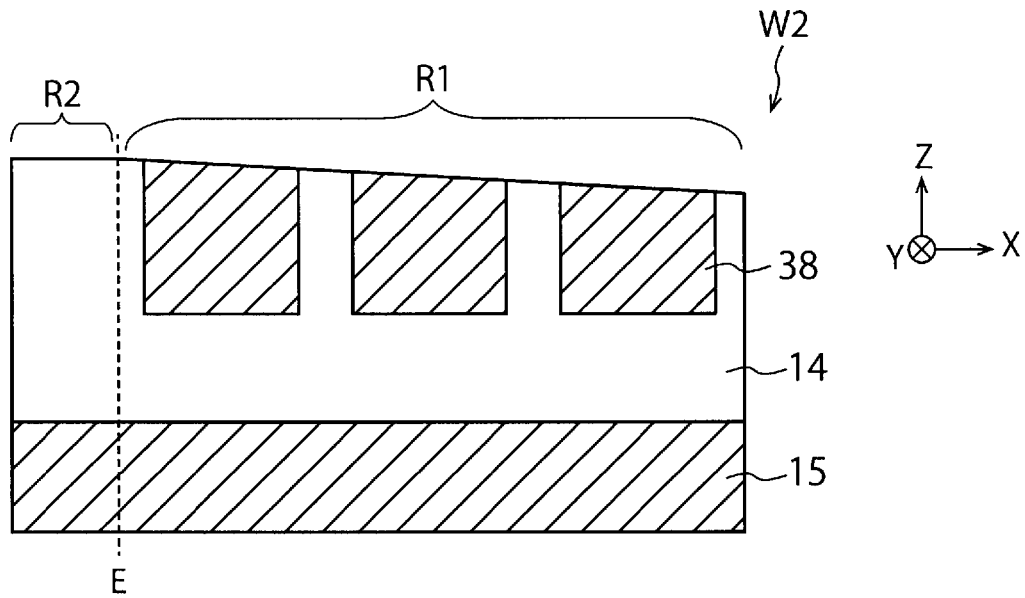
FIGS. 6A and 6B are cross-sectional views showing a problem of the circuit wafer according to the first embodiment.
Figure 6B:
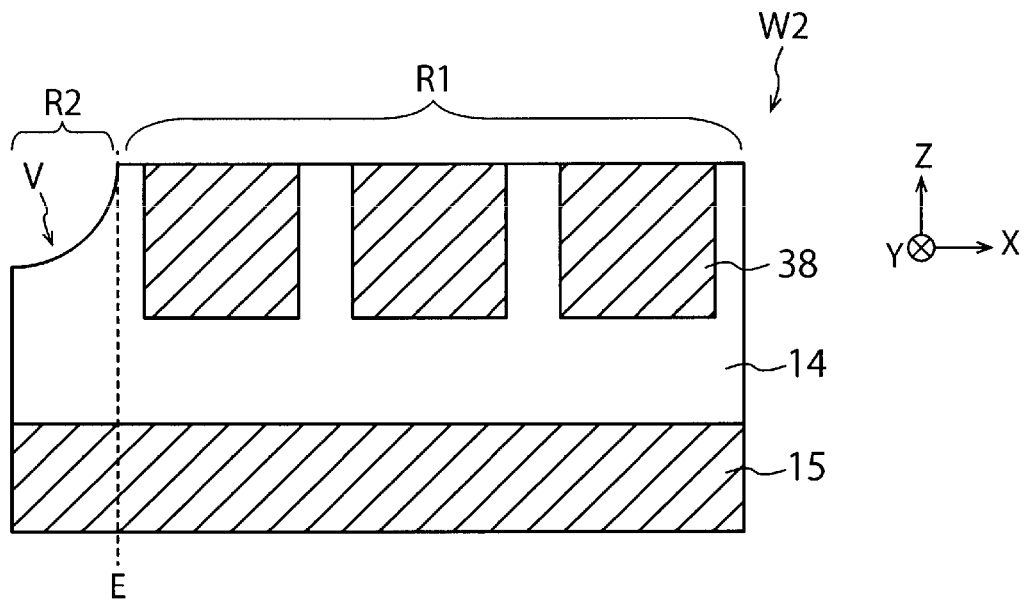

FIGS. 6A and 6B are cross-sectional views showing a problem of the circuit wafer W2 according to the first embodiment.

FIG. 6A shows a cross section of the chip region R1 and the dicing region R2 of the circuit wafer W2. In at least one embodiment, after the metal pad 38 is embedded in the interlayer insulating film 14, a surface of the metal pad 38 is flattened by CMP. At this time, when a slurry having a large polish rate ratio ($Cu/SiO_2$) between the metal pad 38 and the interlayer insulating film 14 is used for CMP, dishing which is a phenomenon that the surface of the metal pad 38 is dented, and an inclination of the surface of the chip region R1 (see, FIG. 6A) may occur.

FIG. 6B also shows the cross section of the chip region R1 and the dicing region R2 of the circuit wafer W2. The dishing and the inclination described above can be reduced by using slurry having a small polish rate ratio ($Cu/SiO_2$) between the metal pad 38 and the interlayer insulating film 14 for CMP. In this case, however, since the interlayer insulating film 14 is more easily scraped, a void may be formed in the interlayer insulating film 14 in a region where a density of the metal pads 38 is low. FIG. 6B shows a void V formed in the dicing region R2 where the metal pad 38 is not disposed. It is desirable to reduce the formation of such a void V.

Figure 7:
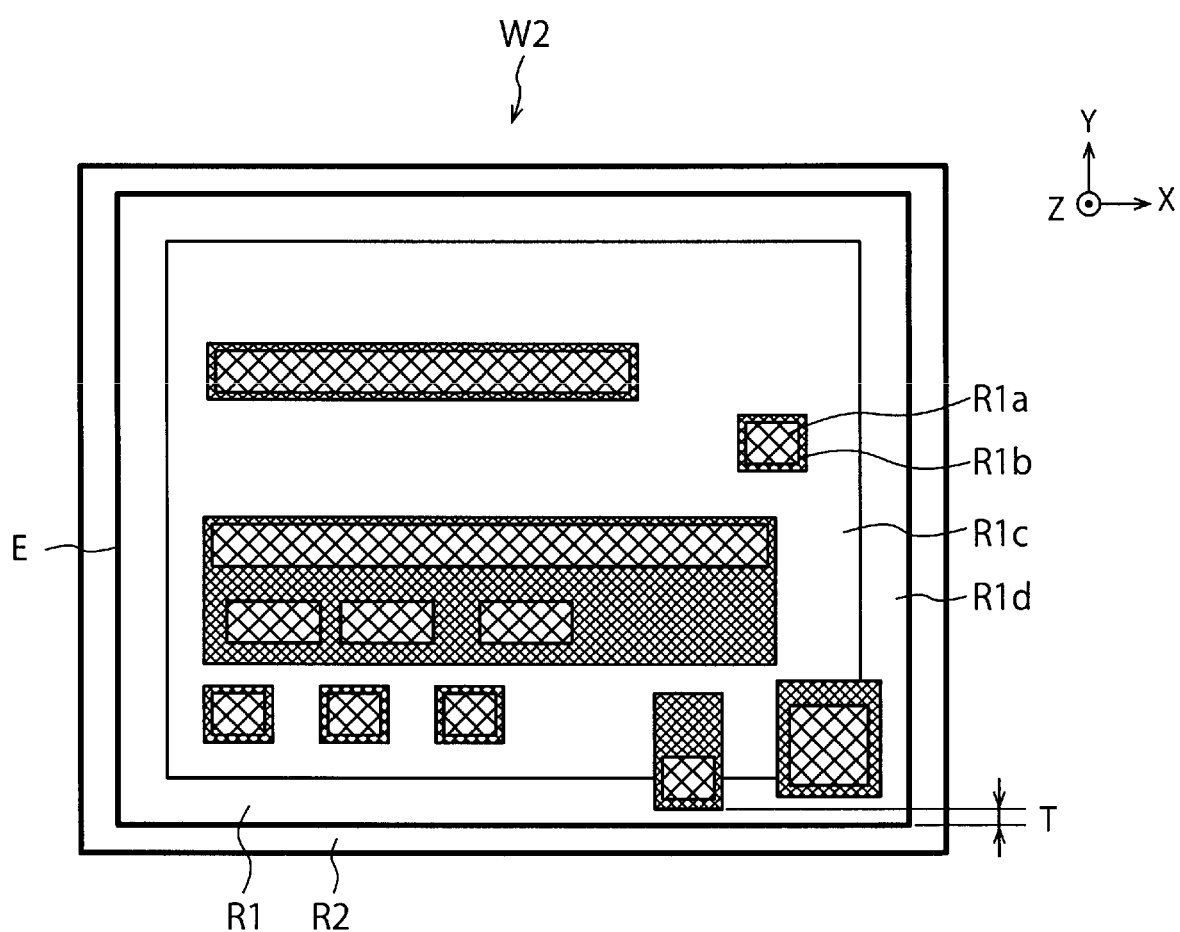
FIG. 7 is a plan view showing the structure of the circuit wafer according to the first embodiment.

FIG. 7 is a plan view showing the structure of the circuit wafer W2 according to the first embodiment. FIG. 7 shows an XY cross section passing through the metal pad 38 in the circuit wafer W2, for example, an XY cross section of the bonding surface S between the array wafer W1 and the circuit wafer W2.

FIG. 7 shows one chip region R1 and the dicing region R2 surrounding the chip region R1. As shown in FIG. 7, the chip region R1 of at least one embodiment includes a plurality of active regions R1a and a plurality of dummy regions R1b, R1c, and R1d.

The active region R1a includes the plurality of metal pads 38 called active pads. On the other hand, the dummy regions R1b, R1c, and R1d include the plurality of metal pads 38 called dummy pads. The active pad is a pad used for transmitting signals and electric power for operating the semiconductor device, and the dummy pad is an unused pad for transmitting signals and electric power for operating the semiconductor device. The active pad is electrically connected to a circuit element (for example, the memory cell array 11 and the transistor 31) in the semiconductor device, but the dummy pad is not electrically connected to the circuit element in the semiconductor device. The dummy pad is disposed to, for example, adjust the density of the metal pads 38 on the bonding surface S.

The dummy regions R1b, R1c, and R1d of at least one embodiment are the dummy region R1b disposed around the active region R1a, the dummy region R1c disposed at a central portion in the chip region R1, and the dummy region R1d disposed at a peripheral portion in the chip region R1. These dummy regions R1b, R1c, and R1d include the metal pads 38 with different densities, as described later.

Next, a coverage (an extent of coverage) of the metal pads 38 in the XY cross section shown in FIG. 7 will be described. For example, the coverage of the metal pads 38 in the chip region R1 is a percentage (%) of a total area (Sa) of the metal pads 38 in the chip region R1 with respect to a total area (Sb) of the chip region R1, and is represented by $Sa \div Sb \times 100$. The coverage of the metal pads 38 is a value corresponding to the density of the metal pads 38 in each region.

The active region R1a and the dummy regions R1b, R1c, and R1d of at least one embodiment have predetermined coverages. Specifically, the coverage of the metal pads 38 in the active region R1a is 10 to 40%, for example 25%. The coverage of the metal pads 38 in the dummy region R1b is 10 to 40%, for example 25%. The coverage of the metal pads 38 in the dummy region R1c is 10 to 40%, for example, about 20%. The coverage of the metal pads 38 in the dummy region R1d is 5 to 20%, for example, about 10%.

The dummy region R1d of at least one embodiment has a ring shape surrounding the active region R1a and the dummy regions R1b and R1c, and is adjacent to the dicing region R2. On the other hand, the active region R1a and the dummy regions R1b and R1c of at least one embodiment are surrounded by the dummy region R1d and separated from the dicing region R2. In other words, the dummy region R1d is adjacent to the boundary line E, and the active region R1a and the dummy regions R1b and R1c are separated from the boundary line E.

In addition, the coverage of the metal pads 38 in the dummy region R1d of at least one embodiment is different from the coverages of the metal pads 38 in the active region R1a and the dummy regions R1b and R1c, and more specifically, is lower than the coverages of the metal pads 38 in the active region R1a and the dummy regions R1b and R1c. Accordingly, for example, a depth of the void V forming in the dicing region R2 can be reduced (see, FIGS. 6A and 6B). The reason is that by lowering the coverage of the metal pads 38 in the dummy region R1d, a difference in coverage between the dummy region R1d and the dicing region R2 can be reduced, and a change in the density of the metal pads 38 in a vicinity of the boundary line E can be reduced. The dicing region R2 of at least one embodiment includes an alignment mark formed of metal, and does not include the metal pad 38. The coverage of the metal pads 38 in the dicing region R2 is 0%. The dummy regions R1b and R1c are examples of the first region, the dummy region R1d is an example of the second region, and the active region R1a is an example of a third region.

As described above, the coverage of the metal pads 38 in the dummy region R1d of the at least one is lower than the coverages of the metal pads 38 in the active region R1a and the dummy regions R1b and R1c. Accordingly, the depth of the void V forming in the dicing region R2 can be reduced. In order to effectively reduce the depth of the void V, a ratio of the coverage in the dummy region R1c to the coverage in the dummy region R1d is preferably set between 3:2 and 3:1. The ratio is similar to a ratio of the coverage in the dummy region R1b to the coverage in the dummy region R1d and a ratio of the coverage in the active region R1a to the coverage in the dummy region R1d. Further, a ratio of an average coverage in the active region R1a and the dummy regions R1b and R1c to the coverage in the dummy region R1d is also preferably set between 3:2 and 3:1.

Further, in at least one embodiment, the coverage in the dummy region R1b and the coverage in the dummy region R1b are equal to or less than the coverage in the active region R1a. Specifically, the coverage in the dummy region R1b adjacent to the active region R1a is the same as the coverage in the active region R1a, and the coverage in the dummy region R1c separated from the active region R1a is less than the coverage in the active region R1a. Accordingly, for example, the coverage can be gradually reduced from the active region R1a to the dummy region R1d. The dummy region R1b is an example of a first coverage region, and the dummy region R1c is an example of a second coverage region.

The coverage in each region can be changed, for example, by changing a size of the metal pad 38 or changing a pitch between the metal pads 38. The arrangement of the metal pads 38 in the active region R1a and the dummy regions R1b and R1c of at least one embodiment will be described later.

FIG. 7 further shows a shortest distance T between the dummy region R1b and the dicing region R2. The shortest distance T is, for example, 5 μm or more. On the other hand, a ring width of the dummy region R1d having the ring shape is generally, for example, 100 μm. In FIG. 7, numerous dummy regions R1b are surrounded by the dummy regions R1c, and a part of the dummy regions R1b protrude from the dummy region R1c and are adjacent to the dummy region R1d. Therefore, the above-described shortest distance T can be shorter than the ring width of the dummy region R1d. From another point of view, the ring width of the dummy region R1d is generally 100 μm, but is shorter than 100 μm in a vicinity of the above part of the dummy regions R1b.

Figure 8:
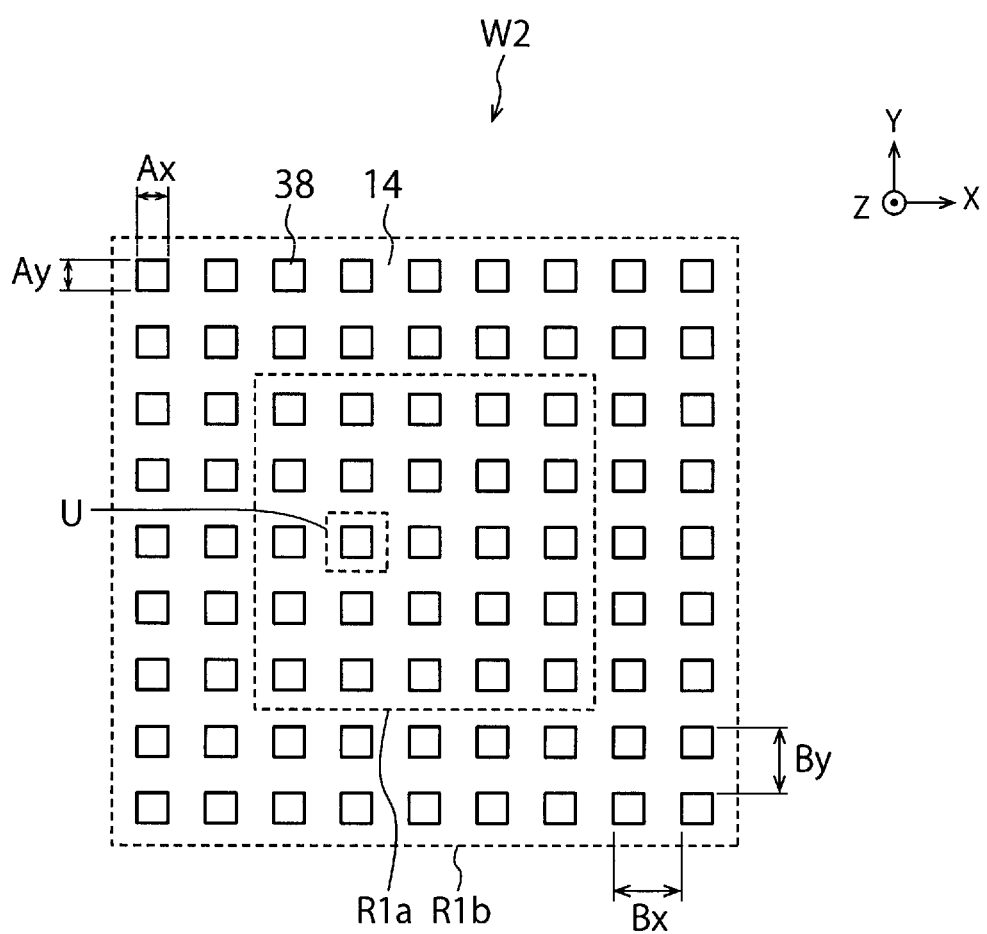
FIG. 8 is a plan view showing structures of an active region and a dummy region according to the first embodiment.

FIG. 8 is a plan view showing structures of the active region R1a and the dummy region R1b according to the first embodiment.

FIG. 8 shows the metal pads 38 in the active region R1a and the metal pads 38 in the dummy region R1b. In FIG. 8, these metal pads 38 are arranged in a square or rectangular grid shape, and the coverage in the active region R1a and the coverage in the dummy region R1b are both set to 25%. Reference numeral U indicates a unit region of the above grid. An area of one unit region U is four times an area of one metal pad 38, and as a result, the coverage in the active region R1a and the dummy region R1b is 25%.

FIG. 8 further relates to the metal pads 38 in the active region R1a and the dummy region R1b, and shows a size Ax of each metal pad 38 in the X direction, a size Ay of each metal pad 38 in the Y direction, a pitch Bx between the metal pads 38 in the X direction, and a pitch By between the metal pads 38 in the Y direction. In at least one embodiment, these relationships are set as Ax=Ay and Bx=By.

Figure 9:
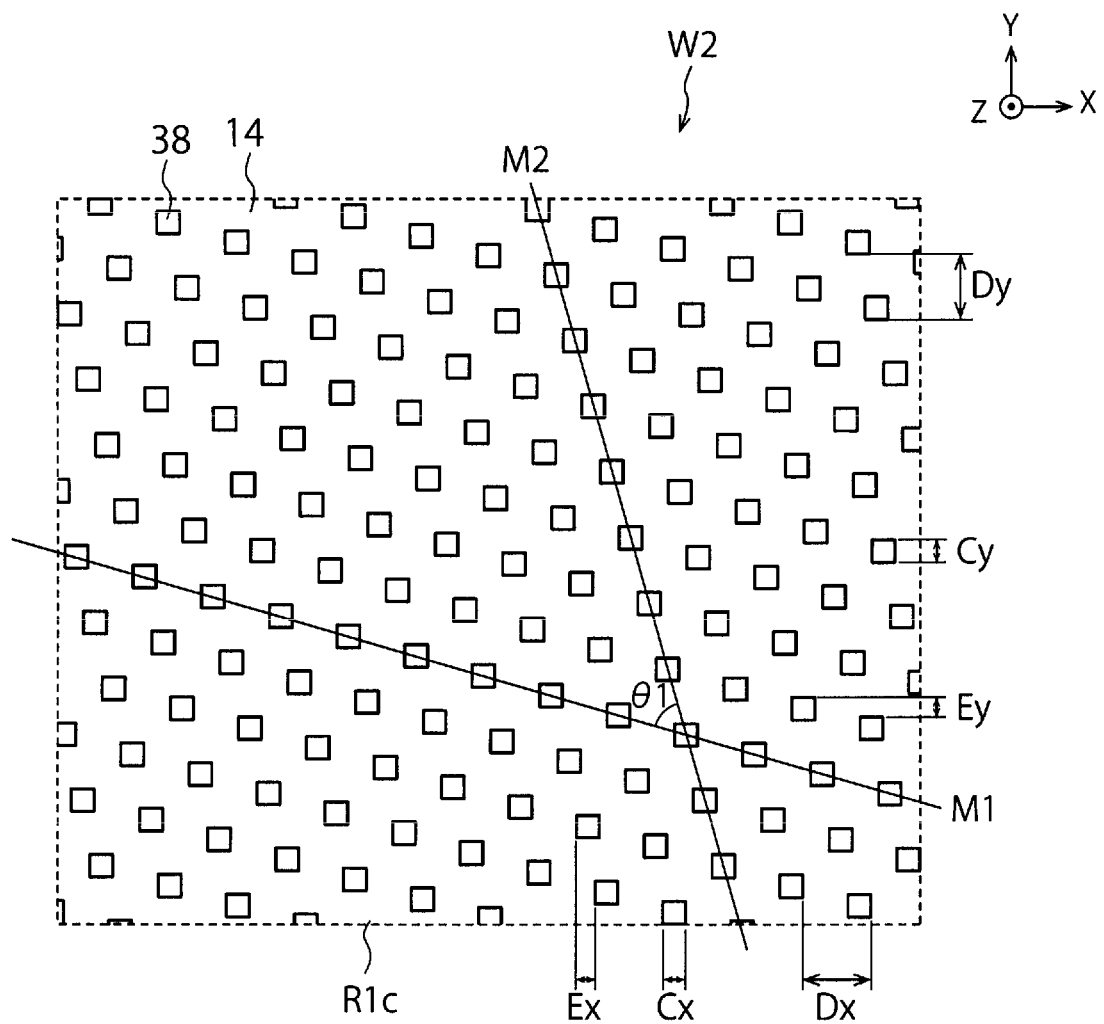
FIG. 9 is a plan view showing a structure of a dummy region according to the first embodiment.

FIG. 9 is a plan view showing a structure of the dummy region R1c according to the first embodiment.

FIG. 9 shows the metal pads 38 in the dummy region R1c. In FIG. 9, these metal pads 38 are arranged in a triangular (or parallelogram) grid shape, and the coverage in the dummy region R1c is set to about 20%. The metal pads 38 in the dummy region R1c are arranged at intersections of a plurality of first straight lines parallel to a straight line M1 and a plurality of second straight lines parallel to a straight line M2. The first straight line is inclined with respect to the X direction, and the second straight line is inclined with respect to the Y direction.

FIG. 9 further relates to the metal pads 38 in the dummy region R1c, and shows a size Cx of each metal pad 38 in the X direction, a size Cy of each metal pad 38 in the Y direction, a pitch Dx between the metal pads 38 in the X direction, and a pitch Dy between the metal pads 38 in the Y direction, a shift amount Ex between the metal pads 38 in the X direction, and a shift amount Ey between the metal pads 38 in the Y direction. In at least one embodiment, these relationships are set as Cx=Cy, Dy=Dz, and Ex=Ey. Further, in at least one embodiment, the size is set to Ax=Cx, and the pitch is set to Bx≠Dx.

Thus, between the dummy region R1b and the dummy region R1c, the sizes of the metal pads 38 are the same in the X direction and in the Y direction, and the pitches between the metal pads 38 are different from each other. As a result, the coverages of the metal pads 38 are different from each other between the dummy region R1b and the dummy region R1c. Between the dummy region R1b and the dummy region R1c, the sizes of the metal pads 38 may be different from each other, and the pitches between the metal pads 38 may be the same, so that the coverages may be different from each other.

In at least one embodiment, the dummy region R1b is provided between the active region R1a and the dummy region R1c. Therefore, the coverage in the chip region R1 does not decrease between the active region R1a and the dummy region R1b, but decreases between the dummy region R1b and the dummy region R1c. Accordingly, it is possible to reduce the formation of a void at an end portion of the active region R1a. On the other hand, a void may be formed in a vicinity of a boundary between the dummy region R1b and the dummy region R1c, and the dummy pads are disposed in the vicinity of the boundary between the dummy region R1b and the dummy region R1c, but the active pad is not so disposed. Therefore, it is possible to prevent the void from adversely affecting the active pad and hindering the operation of the semiconductor device. This is because the dummy pad generally does not participate in the operation of the semiconductor device.

Hereinafter, an example of a method of determining the arrangement of the metal pads 38 in the dummy region R1c of the present embodiment will be described.

In at least one embodiment, during determining of the arrangement of the metal pads 38 in the dummy region R1c, a value of Cx (=Cy) is fixed and a value of Ex (=Ey) is changed to various values. Accordingly, since the coverage changes, the value of Ex at which a desired coverage is obtained is calculated. At this time, if the coverage is changed, directions in which the straight lines M1, M2 extend change. As the coverage increases, that is, as Ex decreases, an angle of the straight line M1 with respect to an X axis increases, and an angle of the straight line M2 with respect to a Y axis also increases. As a result, an acute angle θ1 between the straight line M1 and the straight line M2 decreases.

The reason why the arrangement of the metal pads 38 in the dummy region R1c is determined by such a method, according to at least one embodiment, is that it is desirable that the directions in which the straight lines M1, M2 extend are different from the X direction and the Y direction. In other words, a direction in which the metal pads 38 in the dummy region R1c are arranged is offset from a direction in which the metal pads 38 in the active region R1a and the dummy region R1b are arranged, and thus the metal pads 38 are prevented from being continuously arranged in the same direction in the semiconductor device. As a result, a direction in which the metal pads 38 are arranged is discontinuous between the dummy region R1b and the dummy region R1c. This is similar between the dummy region R1b and the dummy region R1c. The reason is that the directions in which the straight lines M1, M2 in FIG. 9 extend are different from directions in which straight lines N1, N2 (described later) in FIG. 10 extend. For example, an acute angle θ2 (described later) between the straight line N1 and the straight line N2 is different from the acute angle θ1 between the straight line M1 and the straight line M2.

Further, the reason why the metal pads 38 are prevented from being continuously arranged in the same direction in the semiconductor device, according to least one embodiment is as follows.

When the array wafer W1 and the circuit wafer W2 are bonded together, the bonding of the wafers progresses from a central portion to an end portion of each wafer (bonding progress). Here, a bonding progress speed of the wafer depends on the arrangement of the metal pads 38, 41.

Generally, the surfaces of the metal pads 38, 41 are recessed with respect to surfaces of the interlayer insulating films 14, 13 during bonding, and the bonding of the wafers progresses faster in a direction without the metal pads 38, 41 (bonding progress speed is higher). This is because not many surfaces of the metal pads 38, 41 exist, and many surfaces of the interlayer insulating films 14, 13 exist in that direction. The metal pad 38 and the metal pad 41 are bonded (joined) by expansion of the metal pads 38, 41 in an annealing treatment after bonding.

Therefore, if the metal pads 38 are continuously arranged in the same direction in the semiconductor device, the bonding progress speed in that direction is smaller than the bonding progress speed in other directions, and the bonding progress speed is uneven between the wafers. When the bonding progress speed is uneven between the wafers, the bonded region goes around a tip portion of the non-bonded region, and as a result, a void is formed between the wafers. Since the void hinders the joining between the metal pads 38, when the active region R1a is in a vicinity of the void, a defect may occur in the semiconductor device.

The above is the reason that the metal pads 38 are prevented from being continuously arranged in the same direction in the semiconductor device according to at least one embodiment. According to the at least one embodiment, by offsetting the direction in which the metal pads 38 in the dummy region R1c are arranged from the direction in which the metal pads 38 in the active region R1a and the dummy region R1b are arranged, it is possible to prevent the metal pads 38 from being continuously arranged in the same direction in the semiconductor device.

Figure 10:
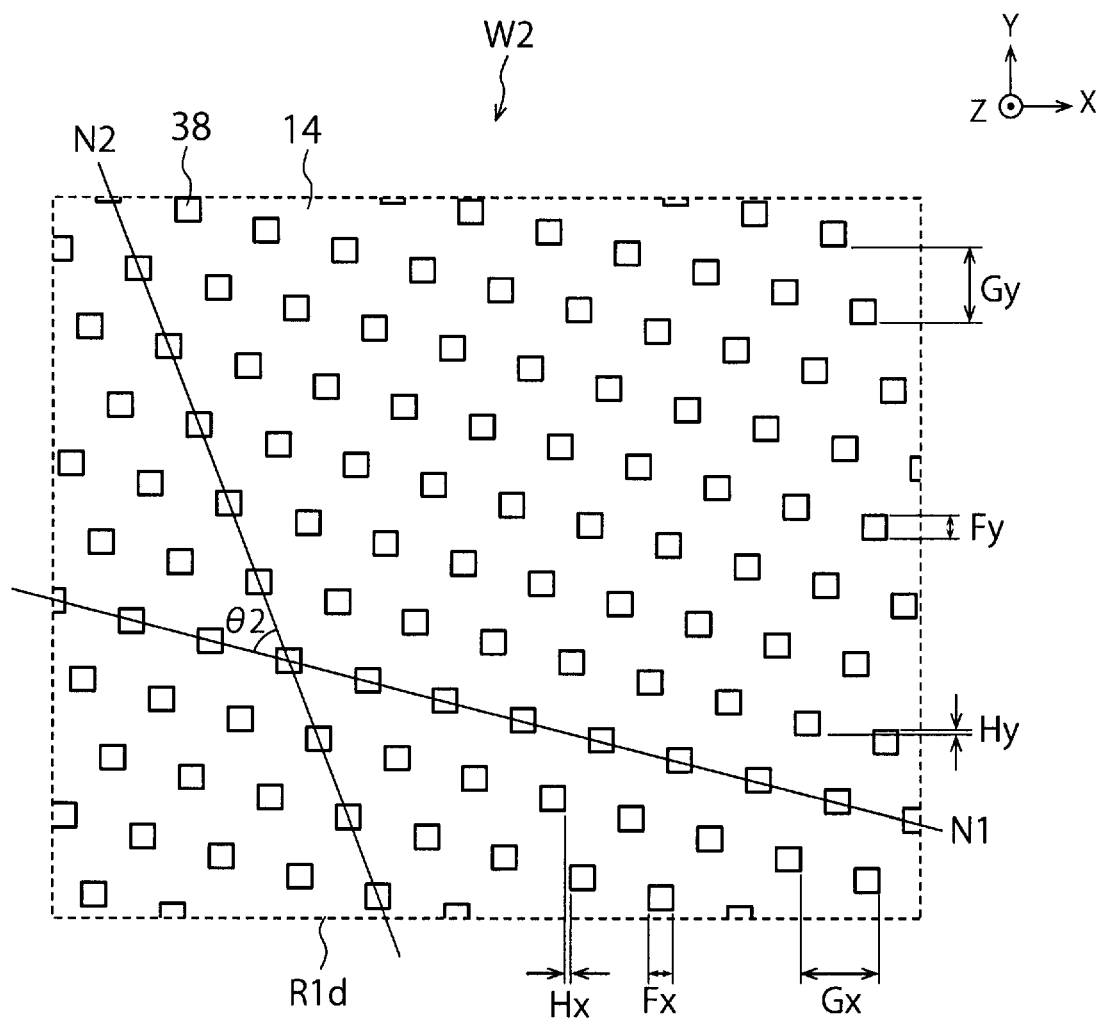
FIG. 10 is a plan view showing a structure of a dummy region according to the first embodiment.

FIG. 10 is a plan view showing a structure of the dummy region R1d according to the first embodiment.

FIG. 10 shows the metal pads 38 in the dummy region R1d. In FIG. 10, these metal pads 38 are arranged in a triangular (or parallelogram) grid shape, and the coverage in the dummy region R1d is set to about 10%. The metal pads 38 in the dummy region R1d are arranged at intersections of the plurality of first straight lines parallel to the straight line N1 and the plurality of second straight lines parallel to the straight line N2. The first straight line is inclined with respect to the X direction, and the second straight line is inclined with respect to the Y direction.

FIG. 10 further relates to the metal pads 38 in the dummy region R1d, and shows a size Fx of each metal pad 38 in the X direction, a size Fy of each metal pad 38 in the Y direction, a pitch Gx between the metal pads 38 in the X direction, and a pitch Gy between the metal pads 38 in the Y direction, a shift amount Hx between the metal pads 38 in the X direction, and a shift amount Hy between the metal pads 38 in the Y direction. In at least one embodiment, these relationships are set as Fx=Fy, Gx=Gy, and Hx=Hy. Further, in the present embodiment, the size is set to Cx=Fx, and the pitch is set to Dx≠Gx.

Thus, between the dummy region R1c and the dummy region R1d, the sizes of the metal pads 38 are the same in the X direction and in the Y direction, and the pitches between the metal pads 38 are different from each other. As a result, the coverages of the metal pads 38 are different from each other between the dummy region R1c and the dummy region R1d. Between the dummy region R1c and the dummy region R1d, the sizes of the metal pads 38 may be different from each other, and the pitches between the metal pads 38 may be the same, so that the coverages may be different from each other.

During manufacturing of the semiconductor device of the present embodiment, the metal pads 38 are formed in the interlayer insulating film 14 so as to realize the above-described coverage (see, FIG. 3). Accordingly, the coverages in the active region R1a, the dummy region R1b, the dummy region R1c, and the dummy region R1d are set to 25%, about 20%, and about 10%, respectively.

As a method of determining the arrangement of the metal pads 38 in the dummy region R1d of at least one embodiment, for example, the same method as in the case of the dummy region R1c can be adopted. However, since the dummy region R1c and the dummy region R1d have different coverages, the direction in which the straight lines M1, M2 in FIG. 9 extend and the direction in which the straight lines N1, N2 in FIG. 10 extend are different. According to at least one embodiment, by offsetting a direction in which the metal pads 38 in the dummy region R1d are arranged from the direction in which the metal pads 38 in the dummy region R1c are arranged, it is possible to prevent the metal pads 38 from being continuously arranged in the same direction in the semiconductor device.

Figure 11:
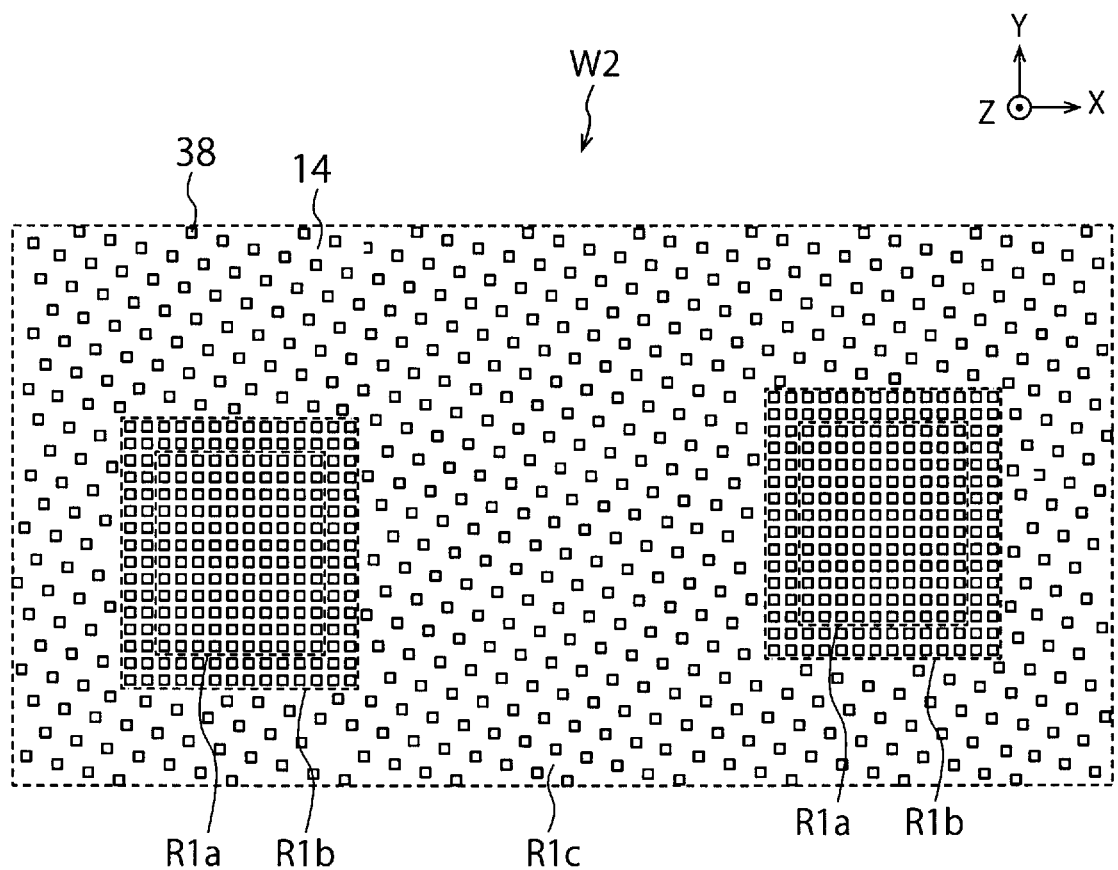
FIG. 11 is a plan view showing a structure of a vicinity of a boundary between the dummy region R1$b$ and the dummy region according to the first embodiment.

FIG. 11 is a plan view showing a structure of the vicinity of the boundary between the dummy region R1b and the dummy region R1c according to the first embodiment.

As shown in FIG. 11, a layout of the metal pads 38 changes in the vicinity of the boundary between the dummy region R1b and the dummy region R1c. As a result, the coverage of the metal pads 38 changes between the dummy region R1b and the dummy region R1c.

Figure 12:
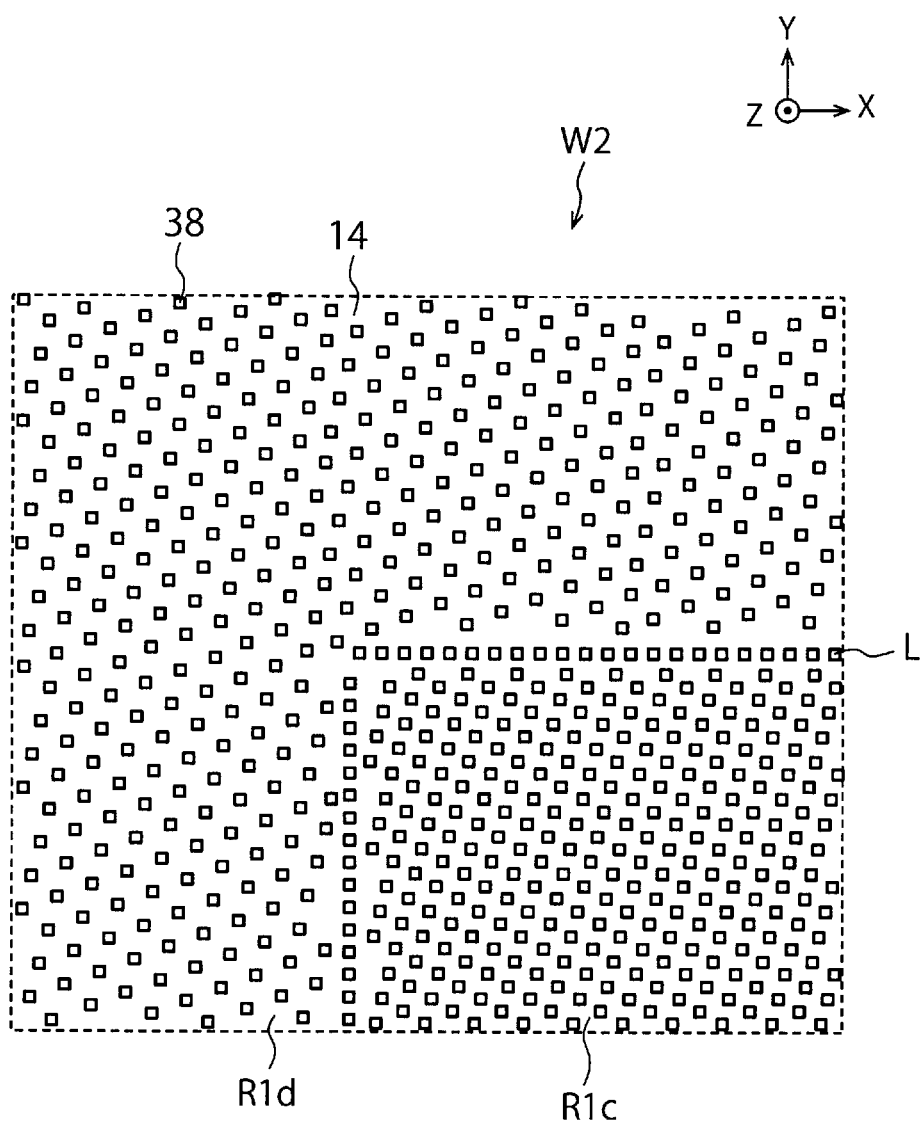
FIG. 12 is a plan view showing a structure of a vicinity of a boundary between the dummy region and the dummy region according to the first embodiment.

FIG. 12 is a plan view showing a structure of a vicinity of a boundary between the dummy region R1c and the dummy region R1d according to the first embodiment.

The circuit wafer W2 of at least one embodiment includes the plurality of metal pads 38 arranged in a line along a boundary line (boundary surface) L between the dummy region R1c and the dummy region R1d. Accordingly, for example, it is possible to reduce an occurrence of a large space in which the metal pad 38 is not arranged between the dummy region R1c and the dummy region R1d. By reducing the occurrence of such a space, it is possible to reduce the formation of voids between the dummy region R1c and the dummy region R1d.

Figure 13:
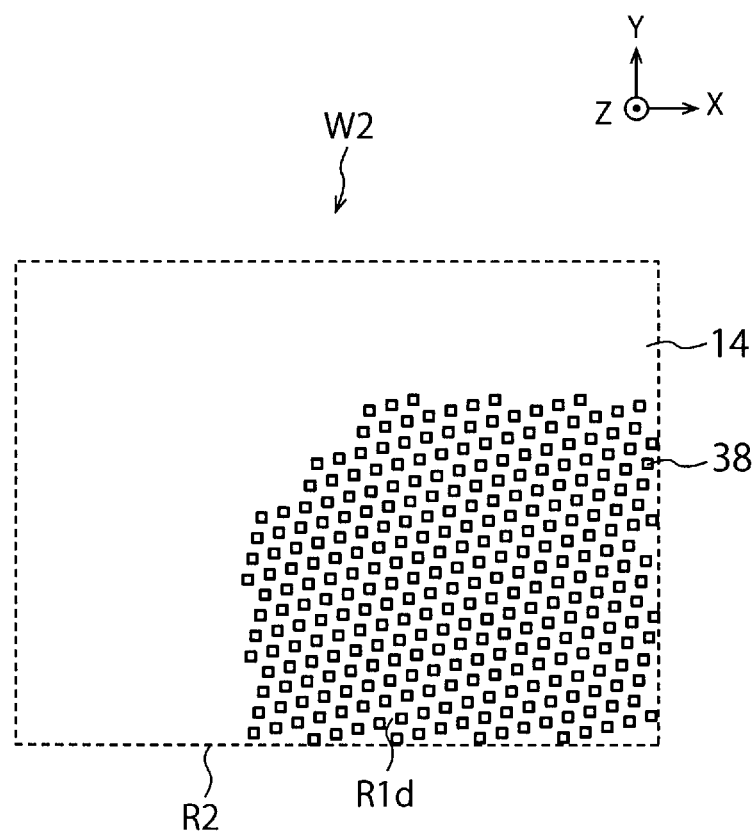
FIG. 13 is a plan view showing a structure of a vicinity of a boundary between the dummy region and a dicing region according to the first embodiment.

FIG. 13 is a plan view showing a structure of a vicinity of a boundary between the dummy region R1d and the dicing region R2 according to the first embodiment.

As shown in FIG. 13, the dummy region R1d includes the metal pads 38, but the dicing region R2 does not include the metal pads 38. However, the coverage in the dummy region R1d is set lower than the coverages in the active region R1a, the dummy region R1b, and the dummy region R1c. Therefore, according to at least one embodiment, the depth of the void V occurring in the dicing region R2 can be reduced.

Figure 14A:
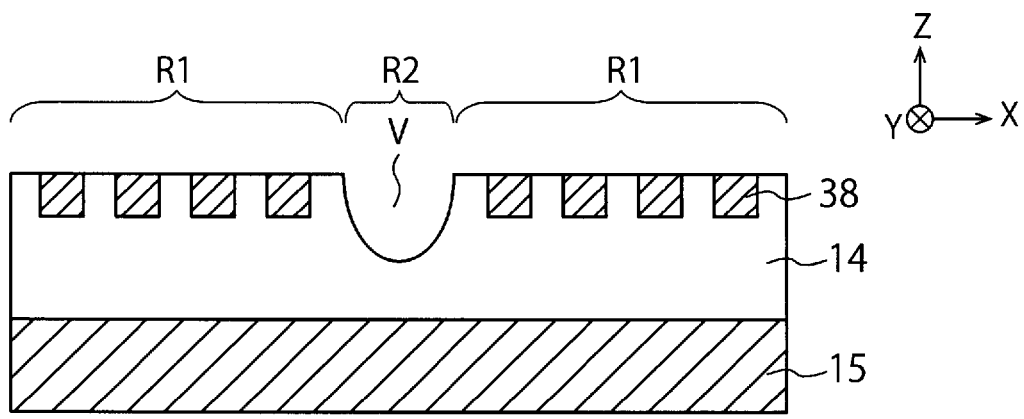
FIGS. 14A and 14B are cross-sectional views showing an operation of the circuit wafer according to the first embodiment.
Figure 14B:
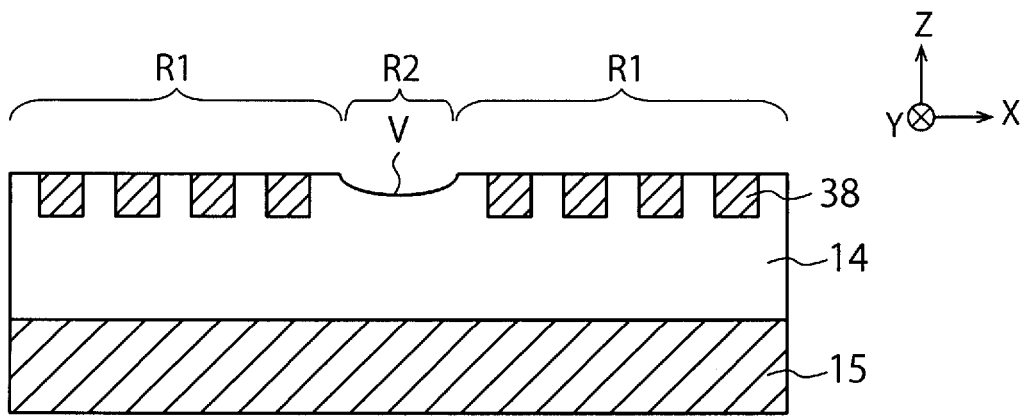

FIGS. 14A and 14B are cross-sectional views showing an operation of the circuit wafer W2 according to the first embodiment.

FIG. 14A shows the void V when the coverage in the dummy region R1d is set to 25%. FIG. 14B shows the void V when the coverage in the dummy region R1d is set to about 10%. According to at least one embodiment, by setting the coverage in the dummy region R1d to be low, the depth of the void V formed in the dicing region R2 can be reduced.

As described above, the coverage of the metal pads 38 of at least one embodiment is different between the active region R1a, the dummy region R1b, and the dummy region R1c, which are separated from the dicing region R2, and the dummy region R1d, which is adjacent to the dicing region R2. For example, the coverage in the dummy region R1d is lower than the coverages in the active region R1a, the dummy region R1b, and the dummy region R1c. Therefore, according to at least one embodiment, it is possible to reduce the occurrence of the defect such as the large void V in the interlayer insulating film 14 in which the metal pads 38 are embedded. It is similar to the metal pad 41 and the interlayer insulating film 13 in the array wafer W1.

While certain embodiments have been described, these embodiments have been presented by way of example only, and are not intended to limit the scope of the disclosure. Indeed, the novel embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
  a substrate;
  a logic circuit disposed on the substrate;
  a plurality of first dummy pads disposed above the logic circuit, and are not electrically connected to the logic circuit,
  a plurality of second dummy pads disposed on the plurality of first dummy pads; and
  a memory cell array disposed above the plurality of second dummy pads, and
  when viewed from a first direction perpendicular to the substrate, a coverage of the substrate by the plurality of first dummy pads is different between a first region and a second region, the first region is separated from a first end side of the substrate along to the second direction parallel to the substrate, and the second region is disposed between the first end side and the first region along the second direction.

2. The semiconductor device according to claim 1, wherein
  the coverage in the first region is from 10 to 40%.

3. The semiconductor device according to claim 1, wherein
  the coverage in the second region is from 5 to 20%.

4. The semiconductor device according to claim 1, wherein
  a ratio of the coverage in the first region to the coverage in the second region is between 3:2 and 3:1.

5. The semiconductor device according to claim 1, wherein
  the second region has a ring shape surrounding the first region.

6. The semiconductor device according to claim 1, wherein
  a size of the first dummy pads in the first region and a size of the first dummy pads in the second region are the same.

7. The semiconductor device according to claim 6, wherein
  a pitch between the first dummy pads in the first region and a pitch between the first dummy pads in the second region are different.

8. The semiconductor device according to claim 1, wherein
  a pitch between the first dummy pads in the first region and a pitch between the first dummy pads in the second region are the same.

9. The semiconductor device according to claim 8, wherein
  a size of the first dummy pads in the first region and a size of the first dummy pads in the second region are different.

10. A semiconductor device, comprising:
  a wafer;
  a logic circuit disposed on the wafer;
  a plurality of first dummy pads disposed above the logic circuit and are not electrically connected to the logic circuit;
  a plurality of second dummy pads disposed on the plurality of first dummy pads; and
  a memory cell array disposed above the plurality of second dummy pads; and
  when viewed from a first direction perpendicular to the wafer, a coverage of the substrate by the plurality of first dummy pads is different between a first region and a second region, the first region is separated from a dicing region along to the second direction parallel to the substrate, and the second region is disposed between a first end side and the first region along the second direction.

11. The semiconductor device according to claim 10, wherein
the dicing region does not include the first dummy pads.

12. A semiconductor device, comprising:
a first chip; and
a second chip bonded to the first chip, wherein
the first chip includes:
  a substrate;
  a logic circuit disposed on the substrate; and
  a plurality of first dummy pads that are disposed above the logic circuit, are disposed on a first bonding surface where the first chip is bonded to the second chip, the plurality of first dummy pads not being electrically connected to the logic circuit,
the second chip includes:
  a plurality of second dummy pads disposed on the plurality of first dummy pads; and
  a memory cell array disposed above the plurality of second dummy pads, and
wherein coverage of the first dummy pads on the first bonding surface is different between a first region and a second region, the first region separated from a first end side of the first chip, the second region disposed between the first end side and the first region,
the first chip further includes:
  a plurality of first active pads that are disposed above the logic circuit, are disposed on the first bonding surface, and are electrically connected to the logic circuit;
the second chip further includes:
  a plurality of second active pads disposed on the plurality of first active pads; and
  coverage of the first active pads on the first bonding surface in a third region is equal to or more than the coverage of the first dummy pads in the first region.

13. The semiconductor device according to claim 12, wherein
the first region includes a first coverage region and second coverage region, the first coverage region having a same coverage of the first dummy pads as the coverage of the first active pads in the third region, the second coverage region having a coverage of the first dummy pads less than the coverage of the first active pads in the third region.

14. The semiconductor device according to claim 13, wherein
the first dummy pads include a plurality of dummy pads arranged in a line along a boundary line between the first coverage region and the second coverage region.

* * * * *